(12) United States Patent
Wang et al.

(10) Patent No.: US 6,413,382 B1
(45) Date of Patent: Jul. 2, 2002

(54) PULSED SPUTTERING WITH A SMALL ROTATING MAGNETRON

(75) Inventors: Wei Wang, Santa Clara; Praburam Gopalraja, Sunnyvale; Jianming Fu, San Jose; Zheng Xu, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/705,324

(22) Filed: Nov. 3, 2000

(51) Int. Cl.$^7$ .............................................. C23C 14/35
(52) U.S. Cl. ........................ 204/192.12; 204/298.08; 204/298.17; 204/298.2; 204/298.22
(58) Field of Search ................ 204/192.12, 298.08, 204/298.17, 298.2, 298.22

(56) References Cited

U.S. PATENT DOCUMENTS

| | | |
|---|---|---|
| 5,789,071 A | 8/1998 | Sproul et al. ............... 428/216 |
| 5,810,982 A | 9/1998 | Sellers .................. 204/298.08 |
| 5,976,327 A | 11/1999 | Tanaka .................. 204/192.15 |

FOREIGN PATENT DOCUMENTS

WO    WO 00/48226 A1    8/2000    ............ H01J/37/34

OTHER PUBLICATIONS

Kouznetsov et al., "A novel pulsed magnetron sputter technique utilizing very high target power densities", *Surface and Coatings Technology*, vol. 122, 1999, pp. 290–293.

*Primary Examiner*—Steven H. VerSteeg
(74) *Attorney, Agent, or Firm*—Charles S. Guenzer (57) ABSTRACT

A magnetron sputter reactor having a target that is pulsed with a duty cycle of less than 10% and preferably less than 1% and further having a small magnetron of area less than 20% of the target area rotating about the target center, whereby a very high plasma density is produced during the pulse adjacent to the area of the magnetron. The power pulsing frequency needs to be desynchronized from the rotation frequency so that the magnetron does not overlie the same area of the magnetron during different pulses. Advantageously, the power pulses are delivered above a DC background level sufficient to continue to excite the plasma so that no ignition is required for each pulse.

27 Claims, 4 Drawing Sheets

PULSED SPUTTERING WITH A SMALL ROTATING MAGNETRON

FIELD OF THE INVENTION

The invention relates generally to sputtering of materials. In particular, the invention relates to sputtering apparatus and a method capable of producing a high fraction of ionized sputter particles.

BACKGROUND ART

Sputtering, alternatively called physical vapor deposition (PVD), is the most prevalent method of depositing layers of metals and related materials in the fabrication of semiconductor integrated circuits. In particular, the sputtered metals are used in forming the many layers of electrical interconnects required in advanced integrated circuits. However, advanced integrated circuit structures have via holes connecting two layers of metallization and formed through an intermediate dielectric layer. These via holes tend to be narrow and deep with aspect ratios of 5:1 and greater in advanced circuits. Coating the bottom and sides of these holes by sputtering is difficult because sputtering is fundamentally a ballistic and generally isotropic process in which the bottom of a via hole is shielded from most of an isotropic sputtering flux.

It has been long recognized, however, that if a large fraction of the sputtered particles are ionized, the positively charged sputtered ions can be accelerated towards a negatively charged wafer and reach deep into high aspect-ratio holes.

This approach has long been exploited in high-density plasma sputter reactors in which the ionization density of the sputtering working gas, typically argon, is increased to a high level by, for example, using inductive RF coils to create a remote plasma source. As a result of the high-density plasma, a large fraction of the sputtered metal atoms passing through the argon plasma are ionized and thus can be electrically attracted to the biased wafer support. However, the argon pressure needs to be maintained relatively high, and the argon ions are also attracted to the wafer, resulting in a hot process. The sputtered films produced by this method are not always of the best quality.

A recently developed technology of self-ionized plasma (SIP) sputtering allows plasma sputtering reactors to be only slightly modified but to nonetheless achieve efficient filling of metals into high aspect-ratio holes in a low-pressure, low-temperature process. This technology has been described by Fu et al. in U.S. patent application Ser. No. 09/546,798, filed Apr. 11, 2000, now issued as U.S. Pat. No. 6,306,265, and by Chiang et al. in U.S. patent application Ser. No. 09/414,614, filed Oct. 8, 1999, both incorporated herein by reference in their entireties. An earlier form of the former reference has been published as PCT publication WO 00/48226 on Aug. 17, 2000.

The SIP sputter reactor employs a variety of modifications to a fairly conventional capacitively coupled magnetron sputter reactor to generate a high-density plasma adjacent to the target and to extend the plasma and guide the metal ions toward the wafer. Relatively high amounts of DC power are applied to the target, for example, 20 to 40 kW for a chamber designed for 200 mm wafers. Furthermore, the magnetron has a relatively small area so that the target power is concentrated in the smaller area of the magnetron, thus increasing the power density supplied to the HDP region adjacent the magnetron. The small-area magnetron is disposed to a side of a center of the target and is rotated about the center to provide more uniform sputtering and deposition.

In one type of SIP sputtering, the magnetron has unbalanced poles, usually a strong outer pole of one magnetic polarity surrounding a weaker inner pole. The total magnetic flux integrated over the area of the outer pole is at least 150% of that of the inner pole. The magnetic field lines emanating from the stronger pole may be decomposed into not only a conventional horizontal magnetic field adjacent the target face but also a vertical magnetic field extending toward the wafer. The vertical field lines extend the plasma closer toward the wafer and also guide the metal ions toward the wafer. Furthermore, the vertical magnetic lines close to the chamber walls act to block the diffusion of electrons from the plasma to the grounded shields. The reduced electron loss is particularly effective at increasing the plasma density and extending the plasma across the processing space.

Gopalraja et al. disclose another type of SIP sputtering, called SIP+ sputtering, in U.S. patent application Ser. No. 09/518,180, filed Mar. 2, 2000 now U.S. Pat. No. 6,277,249, also incorporated herein by reference in its entirety. SIP+ sputtering relies upon a target having a shape with an annular vault facing the wafer. Magnets of opposed polarities disposed behind the facing sidewalls of the vault produce a high-density plasma in the vault. The magnets usually have a small circumferential extent along the vault sidewalls and are rotated about the target center to provide uniform sputtering. Although some of the designs use asymmetrically sized magnets, the magnetic field is mostly confined to the volume of the vault.

SIP sputtering may be accomplished without the use of RF inductive coils. The small HDP region produced by a small-area SIP magnetron is sufficient to ionize a substantial fraction of metal ions, estimated to be between 10 and 25%, which is sufficient to reach into deep holes. Particularly at the high ionization fraction, the ionized sputtered metal atoms are attracted back to the targets and sputter yet further metal atoms. As a result, the argon working pressure may be reduced without the plasma collapsing. Therefore, argon heating of the wafer is less of a problem, and there is reduced likelihood of the metal ions colliding with argon atoms, which would both reduce the ion density and randomize the metal ion sputtering pattern.

However, SIP sputtering could still be improved. The ionization fraction is only moderately high. The remaining 75 to 90% of the sputtered metal atoms are neutral and not subject to acceleration toward the biased wafer. This generally isotropic neutral flux does not easily enter high-aspect ratio holes. Furthermore, the neutral flux produces a non-uniform thickness between the center and the edge of the wafer since the center is subjected to deposition from a larger area of the target than does the edge when accounting for the wider neutral flux pattern. Further increases in target power would increase the ionization levels. However, large power supplies become increasingly costly, and this problem will be exacerbated for 300 mm wafers. Also, increases in power applied to the target requires increased target cooling if the target is not to melt. For these reasons, it is desired to limit the average power applied to sputtering targets.

Short-pulse sputtering is an alternative approach to producing a high metal ionization fraction in a low-pressure chamber, as described by Kouznetsov et al. in "A novel pulsed magnetron sputter technique utilizing very high target power densities," *Surface and Coating Technology*, vol. 122, 1999, pp. 290–293. This techniques apparently uses a stationary magnetron with 50 to 100 $\mu$s pulses of DC power applied to the target with a repetition rate of about 50 Hz, that is, a target power duty cycle of less than 1%. As a result, a relatively modestly sized pulsed DC power supply having an average power capability of the order of tens of kilowatts can deliver peak power of up to 2.4 MW. Kouznetsov et al. have shown effective hole filling with a peak power density of 2.8 kW/cm$^2$. However, the favorable results shown by Kouznetsov et al. have apparently been accomplished with a target having a diameter of 150 mm. Such a target size is adequate for 100 mm wafers, but considerably smaller than the size required for 200 mm or 300 mm wafers. When the power supplies are scaled up for the larger area targets required for the larger wafers now of commercial interest, again the size of the power supply becomes an issue. Switching of large amounts of power is both costly and operationally disadvantageous.

SUMMARY OF THE INVENTION

A pulsed magnetron sputter reactor in which a small magnetron is rotated about the back of a target and DC power is delivered to the target in short pulses having duty cycles of less than 10%, preferably less than 1%. Thereby, a high plasma density is achieved adjacent to the magnetron during the pulse. The rotation waveform and the pulse waveform should be desynchronized.

In one variation, the pulses rise from a DC level sufficient to maintain the plasma in the reactor between pulses. The pulses preferably have a power level at least 10 times the DC level, more preferably 100 times, and most preferably 1000 times for the greatest effect of the invention.

The level of metal ionization can be controlled by varying the peak pulse power. In the case that pulsed power supply is limited by the total pulse energy, the peak pulse power can be controlled by varying the peak pulse width. In a multi-step sputtering process, the pulse width is changed between the steps.

DETAILED DESCRIPTION OF THE PREFERRED EMBODIMENTS

Figure 1:
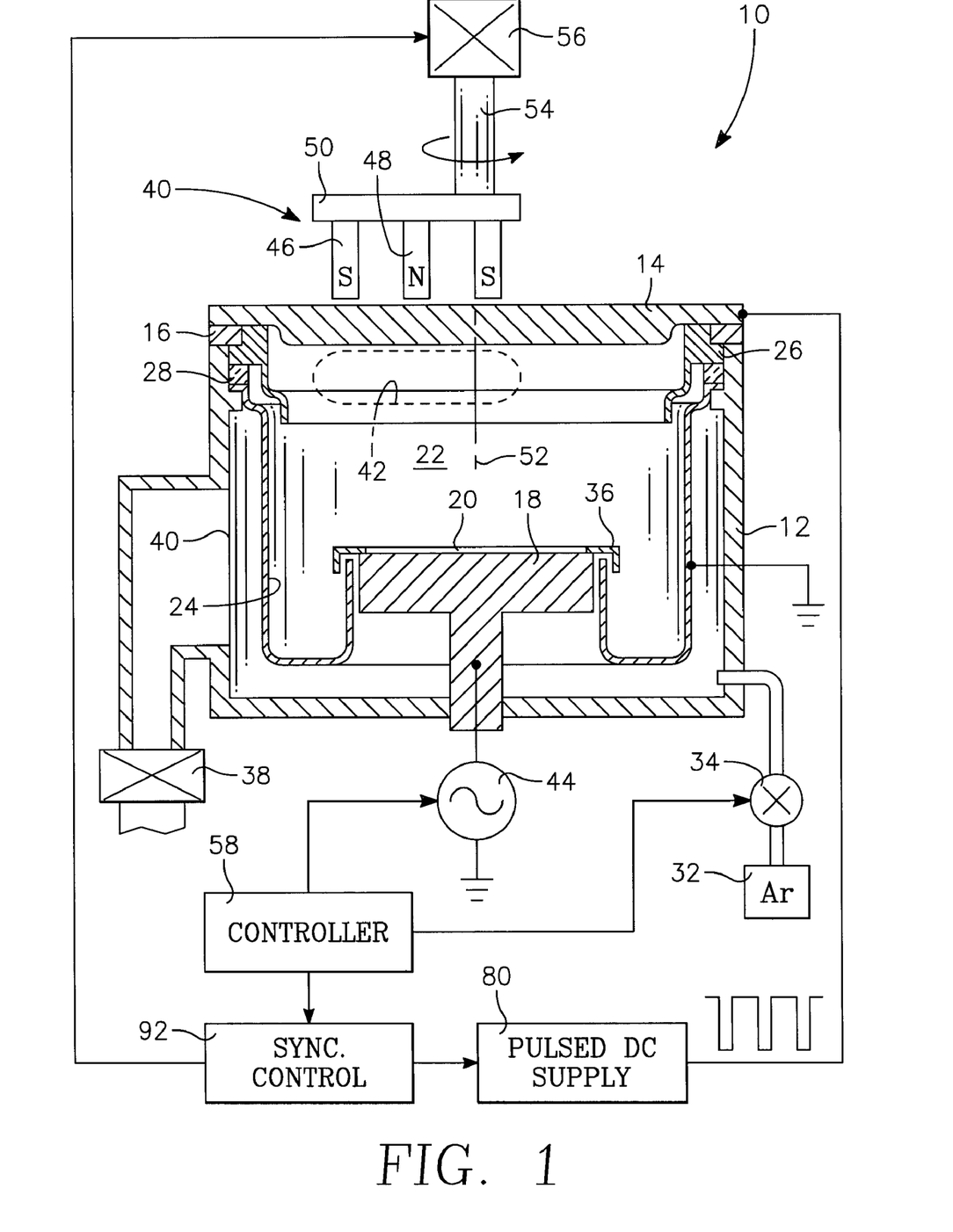
FIG. 1 is a schematic cross-sectional view of a magnetron sputter reactor of one embodiment of the invention.

The invention applies pulsed DC power to a DC plasma sputter reactor with a small rotatable magnetron such as the SIP (self-ionized plasma) reactor 10 illustrated in FIG. 1. Most parts of this reactor have already been described by Chiang et al. in the previously cited patent application. It includes a grounded chamber 12, which supports a planar sputtering target 14 through a dielectric isolator 16. A pedestal electrode 18 supports a wafer 20 to be sputter coated in planar opposition to the target 14 across a processing region 22. A grounded shield 24 protects the chamber walls from sputter deposition and also acts as a grounded anode for the cathode of the negatively biased target 14. A floating shield 26 supported on a second dielectric isolator 28 becomes negatively charged in the presence of a high-density plasma and acts to focus sputtered metal ions towards the wafer 20. A sputter working gas such as argon is supplied from a gas source 32 through a mass flow controller 34 to a region in back of the grounded shield 24. The gas flows into the processing region 22 through a gap formed between the pedestal 18, the grounded shield 24, and a clamp ring or plasma focus ring 36 surrounding the periphery of the wafer 20. A vacuum system 38 pumps the chamber through a pumping port 40.

A DC magnetron sputter reactor conventionally biases the target 14 to between about −300 to −700VDC to support a plasma of the argon working gas. The negatively biased target 14 attracts the positively charged argon ions with sufficient acceleration that they sputter particles from the target, and some of them strike the wafer 20 depositing a layer of the material of the target 14. In reactive sputtering, for example, of TiN using a titanium target, a reactive gas, for example, nitrogen is supplied to the processing space 22 to react with the sputtered titanium to form TiN on the surface of the wafer 20. A small rotatable magnetron 40 is disposed in the back of the target 14 to create a magnetic field near the face of the target 14 which traps electrons from the plasma to increase the electron density. For charge neutrality, the ion density also increases, thus creating a region 42 of a high-density plasma (HDP), which not only increases the sputtering rate but also at sufficiently high density ionizes a substantial fraction of the sputtered particles into positively charged metal ions. To control the energy and direction of the metal ions, an RF bias power supply is connected to the pedestal electrode 18 to create a negative DC self-bias on the wafer 20.

For SIP sputtering, the magnetron 40 is small and unbalanced with a outer magnet 46 of one magnetic polarity surrounding an inner magnet 48 of the other polarity. A magnetic yoke 50 magnetically couples the two backs of the two magnets 46, 48 as well as mechanically supports them. The total magnetic flux of the outer magnet 46 is substantially larger than that of the inner magnet 48, preferably at least 50% greater, so that the unbalanced magnetic field loops far into the processing space 22, thus enlarging the HDP region 42 and guiding the metal ions toward the wafer 20. The magnetron 40 is rotated about a central axis 52 by a motor shaft 54 and attached motor 56. The rotation frequency $f_M$ of the motor 56 and attached magnetron 40 is often though not necessarily in the range of 50 to 200rpm. The rotation scans the HDP region 42 about the face of the target 14 to more evenly erode the target 14 and to produce a more uniform sputter coating on the wafer 20. A computerized controller 58 controls the bias power supply 44 and mass flow controller 34, as illustrated, and additionally controls the motor 56 and target power supply, as will be explained below.

Figure 2:
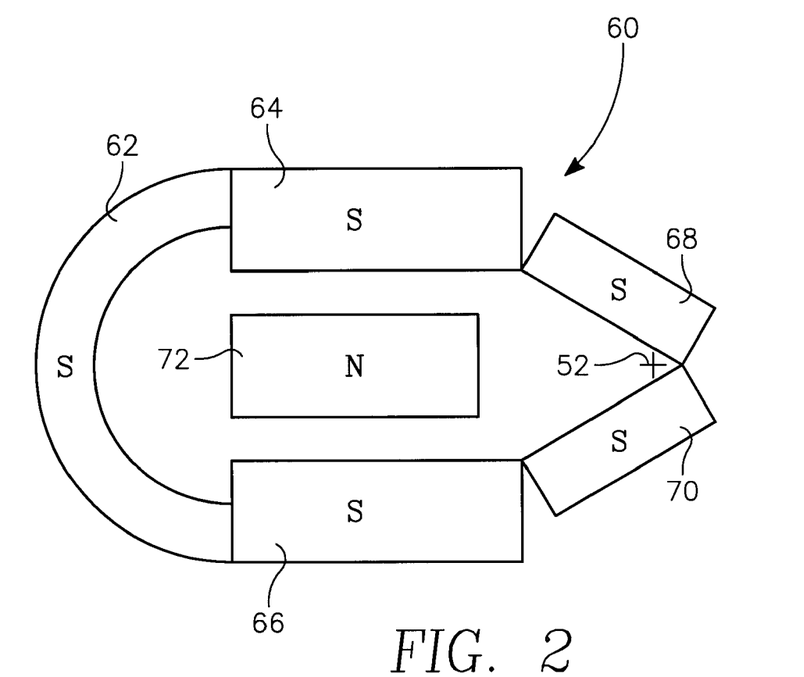
FIG. 2 is a schematic plan view of one magnetron usable in the reactor of FIG. 1.

An advantageous magnetron 60 illustrated in the plan view of FIG. 2 forms the general shape of a torpedo. The figure illustrates the lower pole faces and the respective magnetic polarities of the magnets placed in back of the pole faces. The outer magnet assembly of one magnetic polarity include a semi-circular band 62 positioned near the target periphery, two parallel side bands 64, 66 extending parallel to a radius of the target, and two inclined bands 68, 70 meeting near but slightly outside of the target center 52, about which the magnetron 60 rotates. The outer magnet assembly surrounds a band 72 of the opposite magnetic polarity extending along the target radius.

The magnetron 60 is relatively small compared to the target, having a total area less than 20% and preferably less than 10% of the target. Because the sputtering is concentrated the area of the target below the magnetron, the effect is to increase the power density on the target by a factor of 5 or 10 without using a larger power supply.

Figure 3:
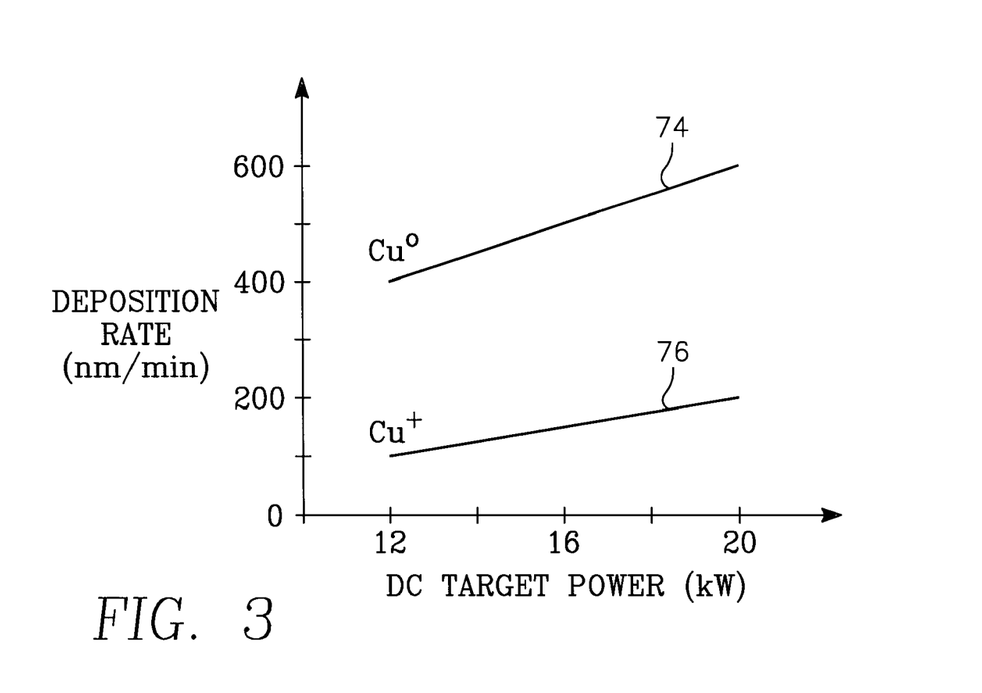
FIG. 3 is a graph illustrating the dependence of the deposition rates of neutral and ionized copper upon the target power.

It is known that both the sputter deposition rate and the ionization fraction increase with target power. As illustrated in the graph of FIG. 3, the deposition rate with the torpedo magnetron 60 varies as a function of DC target power for both copper neutrals, as shown by line 74, and for copper ions, as shown by line 76. Importantly, the ratio of ions to neutrals increases from about 25% at 12 kW to 30% at 20 kW. The linear increase of the ionization ratio is expected to continue to somewhat higher powers, but as previously mentioned the power supply becomes increasingly costly and target cooling becomes a problem.

According to the invention, the target 14 is powered by narrow pulses of negative DC power supplied from a pulsed DC power supply 80, as illustrated in FIG. 1. The pulse form is generically represented in the timing diagram of FIG. 4 and includes a periodic sequence of power pulses 82 having a pulse width $\tau_w$ and a pulse repetition period $\tau_P$, which is the inverse of the pulse repetition frequency $f_P$. The illustrated pulse form is idealized. Its exact shape depends on the design of the pulsed DC power supply 80, and significant rise times and fall times are expected. A long fall time may produce a long tail, but the power levels in the tail will be significantly lower than the peak. Also, in this embodiment, each pulse 82 needs to ignite the plasma and maintain it. The effective chamber impedance dramatically changes between these two phases. A typical pulsed power supply will output relatively high voltage and almost no current in the ignition phase and a lower voltage and substantial current in the maintenance phase. As mentioned by Kouznetsov et al., ignition may require over 50 μs.

The sputtering of the invention increases the achievable target peak power density over that available in either the DC SIP reactor of Fu or the pulsed unrotated reactor of Kouznetsov. As a result, the sputtering of the invention allows for an increase in ionization fractions over what is otherwise available using realistically sized power supplies.

Figure 4:
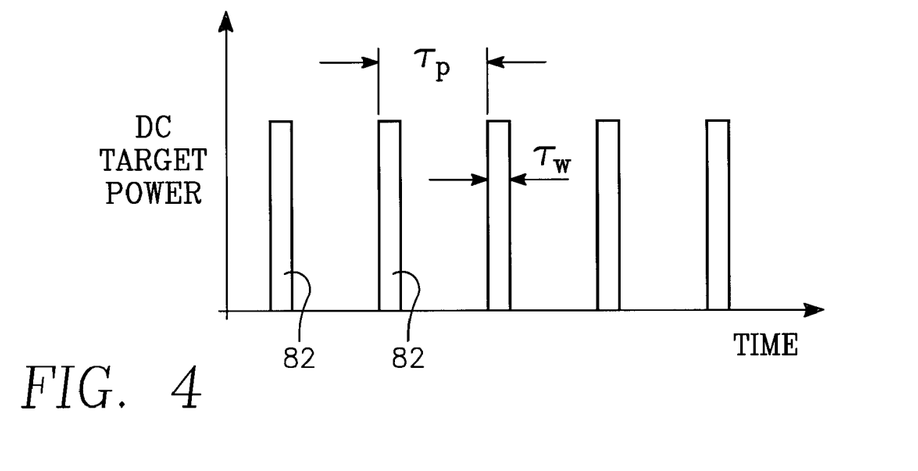
FIG. 4 is a timing diagram of a first inventive method of pulsing the target of the reactor of FIG. 1.

The choice of pulse widths $\tau_w$ is dictated by considerations of both power supply design, radio interference, and sputtering process conditions. Typically, it should be at least 50 μs in this embodiment. Its upper limit is dictated mostly by the pulse repetition period $\tau_P$, but it is anticipated that for most applications it will be less than 1 ms, and typically less than 200 μs is for achieving the greatest effect. The illustrated rectangular pulse widths are idealized. Numerical values of pulse widths should be measured as the full width at half maximum. Where chamber impedance is changing, the power pulse width is preferably specified rather than the current or voltage pulse widths.

The ratio of the pulse width to repetition period $\tau_w/\tau_P$ is preferably less than 10% and more preferably less than 1% to achieve the greatest effect of the invention. This ratio is also referred to as the duty cycle. Because most pulsed power supplies are limited by the average power rather than peak power, a duty cycle of 1% often provides an increase of peak pulsed power by a factor of 100. That is, peak power may be over 1 MW using a 10 kW pulsed power supply. It is anticipated that the copper ionization fraction using the Torpedo magnetron will be well over 80% at these high peak powers.

It is anticipated that the pulse repetition frequency is best maintained around 50 to 500 Hz.

However, it has been recognized that for some complex structures the metal ionization fraction should be reduced from its maximum possible level so that a controlled fraction of sputtered atoms are neutrals. Sometimes, a sputtering process may involve multiple steps in the same sputter reactor with the ion/neutral fraction and wafer bias changed between the steps. For example, Golparaja et al. in U.S. patent application Ser. No. 09/518,180, filed Mar. 2, 2000 now U.S. Pat. No. 6,277,249 discloses a two-step sputtering process in which the first step sputters metal with higher energy and higher ionization fraction in the first step than in the second step. Although the greatest effects of pulsed power are achieved with duty cycles of less than 10% or 1%, for multi-step sputtering, one of the steps may have a higher duty cycle to achieve a more conventional level of plasma density.

The control of the ion/neutral fraction can be effected in the present invention without substantial reduction of deposition rate by varying the duty cycle of the target power while possibly maintaining constant the average target power. Because a typical pulsed power supply is limited by the energy delivered by the pulse, an increase of pulse width is usually accompanied by a reduction of peak power. The selection of pulse width is another control over the sputtering process.

The invention requires both the rotation of the magnetron at a rotation rate $f_M$ and repetitive pulsing of the target at the repetition rate $f_P$. In view of the small magnetron area and the narrow pulse width, the effect is for a single pulse to sputter a single restricted area of the target. Both rates may be the same general range. Heretofore, the exact frequency for either was not important. However, for the invention, it is important that the motor rotation be desynchronized from the pulse repetition. In the worst case, if the two rates are the exactly the same, for example, synchronized to the power line frequency of 50 or 60 Hz, then all pulses will sputter the same small area of the target. Obviously, this would produce non-uniform target erosion and non-uniform sputter deposition on the wafer. The same or nearly the same inferior result would occur if either frequency were exactly a small integer multiple of the other.

Figure 5:
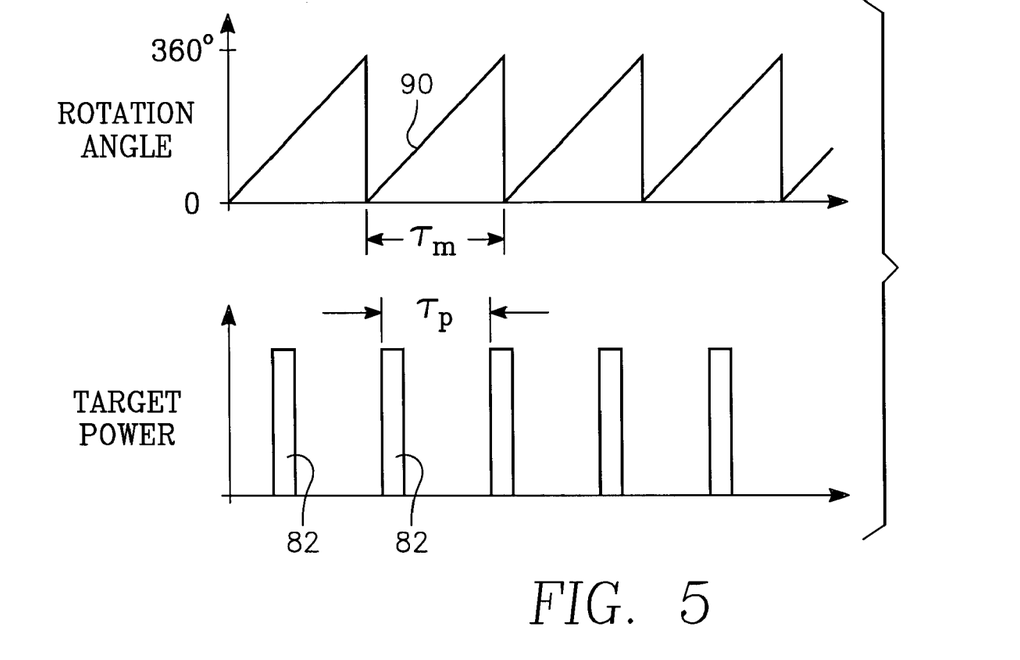
FIG. 5 is a timing diagram illustrating the relationship between magnetron rotation and target pulsing.

Therefore, as illustrated in the timing diagram of FIG. 5, the motor rotation angle waveform 90, characterized by a rotation period $\tau_M$, needs to be desynchronized from the waveform of the target pulses 82 characterized by a repetition period $\tau_P$. This relationship is mathematically expressed as $\tau_M$ and $\tau_P$ being incommensurate, at least for small integers. They will be incommensurate if no integers M and P can be found having a ratio M/P equal to $\tau_M/\tau_P$. The condition will be the same for the frequencies $f_M$ and $f_P$. However, a more practical though approximate way of expressing the condition is that the motor rotation rate $f_M$ and the pulse repetition rate $f_P$ are chosen so that the target is pulsed at at least twenty different angular positions of the magnetron as it is rotated about the target center. Therefore, the target will be sputtered about its entire circumference with little if any discernible angular erosion pattern developing.

Accordingly as shown in FIG. 1, a synchronization controller 92 controlled by the controller 58 controls the frequencies of the pulsed DC power supply 80 and of the motor 56 so that the two remain desynchronized. The synchronization controller 92 may be implemented as software in the controller 58. In the case, where the motor 56 is a stepper motor and the pulsed DC supply is pulsed on pulsed command from the controller 58, the desynchronization is accomplished by assuring that the two pulses do not occur on the same repetitive cycle of the controller 58.

The on-and-off pulsing represented in the waveforms of FIG. 4 can be further improved to benefit semiconductor processing. Plasma ignition, particularly in plasma sputter reactors, has a tendency to generate particles during the initial arcing, which may dislodge large particles from the target or chamber. Any die on the wafer on which any large particle falls is likely to fail, thereby reducing the wafer yield. Also, plasma ignition is an electronically noisy process, and it is best not to generate such noise hundreds of times a second. Each of the previously described short pulses need to ignite the plasma since the target is unpowered between the pulses.

Figure 6:
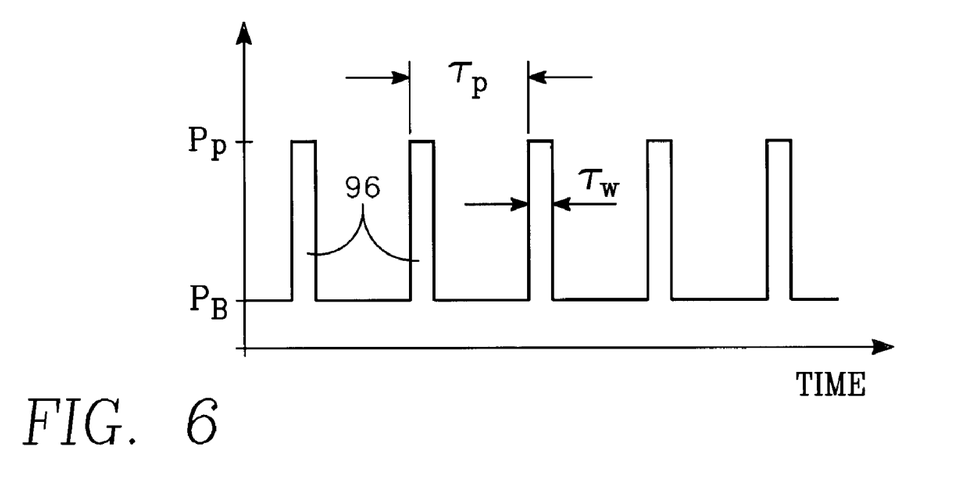
FIG. 6 is a timing diagram of a second inventive method of pulsing the target of the reactor of FIG. 1.

Accordingly, it is advantageous to use a target power waveform illustrated in FIG. 6 in which the target is maintained at a background power level $P_B$ between pulses 96 rising to a peak level $P_P$ corresponding to that contemplated in FIG. 4. The background level $P_B$ is chosen to exceed the minimum power necessary to support a plasma in the chamber at the operational pressure. Preferably, the peak power $P_P$ is at least 10 times the background power $P_B$, more preferably at least 100 times, and most preferably 1000 times to achieve the greatest effect of the invention. A background power $P_B$ of 1 kW will typically be sufficient to support a plasma with the torpedo magnetron and a 200 mm wafer although with little if any actual sputter deposition. As a result, once the plasma has been ignited at the beginning of sputtering prior to the illustrated waveform, no more plasma ignition occurs. Instead, the application of the high peak power $P_P$ instead quickly causes the already existing plasma to spread and increases the density of the plasma.

In one mode of operating the reactor, during the background period, little or no target sputtering is expected. The SIP reactor is advantageous for a low-power, low-pressure background period since the small rotating SIP magnetron can maintain a plasma at lower power and lower pressure than can a larger stationary magnetron. However, it is possible to combine highly ionized sputtering during the pulses with significant neutral sputtering during the background period.

Once again, the actual waveforms will differ from the idealized illustrated ones. In particular, a long fall time for the pulses will present a inter-pulse power that is much lower than the peak power, but may not ever settle to a substantial DC level. However, the minimum power in the inter-pulse period will not fall below a selected DC level.

The initial plasma ignition needs be performed only once and at much lower power levels so that particulates produced by arcing are much reduced. Further, the chamber impedance changes relatively little between the two power levels $P_B$, $P_P$ since a plasma always exist in the chamber. Therefore, the design of the pulsed DC power supply is simplified since it does not need to adjust to vastly different chamber impedances while handling large amounts of power.

Figure 7:
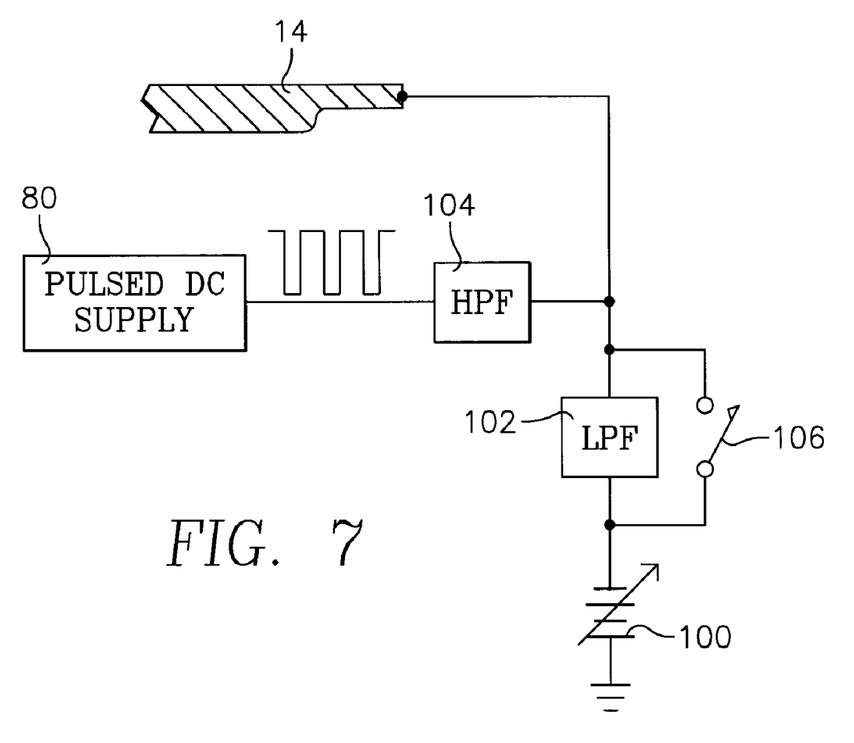
FIG. 7 is an electrical diagram of an embodiment of the power supplies usable with the timing method of FIG. 6.

The background and pulsed power may be generated by distinctly different circuitry, as illustrated in FIG. 7. A variable DC power supply 100 is connected to the target 14 through a low-pass filter 102 and supplies an essentially constant negative voltage to the target 14 corresponding to the background power $P_B$. The pulsed DC power supply 80 produces a train of negative voltage pulses with an essentially zero baseline. It is connected to the target 14 in parallel to the DC power supply 100 through a high-pass filter 104. The time constant of the high-pass filter is preferably chosen to fall between the pulse width $\tau_w$ and the pulse repetition period $\tau_P$. The time constant of the low-pass filter 102 is chosen to be longer than the pulse repetition period $\tau_P$. Advantageously, the plasma may be ignited by the DC power supply 100 before the pulsed power supply 80 is even turned on, thus simplifying the design of the pulsed DC power supply 80. However, it may then be necessary to provide a selectable bypass 106 around the low-pass filter 102 so that the DC power supply 100 can quickly transition its output from plasma ignition to plasma maintenance. An alternative arrangement uses that output of the DC power supply 100 as the reference potential for the pulsed power supply 80, but this arrangement requires careful grounding design and complicates the ignition.

The invention may be applied to other sputter reactors, such as one of the SIP+ reactors described by Golparaja et al. in U.S. patent application Ser. No. 09/518,180, filed Mar. 2, 2000 now U.S. Pat. No. 6,277,249. This reactor includes a target having an annular vault formed its surface facing the wafer. In most of the reactors, the magnetron includes magnets placed in back of both of the sidewalls of the vault, and some portion of the magnetron is scanned around the closed path of the vault to create a localized region of high-density plasma. Accordingly, in the effective area of the magnetron is substantially less than the target area.

The invention thus provides controllable and high plasma densities without the need for excessively large power supplies. The invention also allows controllable metal ionization fractions while maintaining a high deposition rate.

What is claimed is:

1. A pulsed magnetron sputter reactor, comprising:
   a plasma sputter reactor having a target and a pedestal for supporting a substrate to be sputter deposited in opposition to said target;
   a magnetron having an area of less than 20% of the area of the target and being rotatable about a back of said target; and
   a power supply connected to said target and delivering pulses of power of negative voltage with a duty cycle of less than 10%.

2. The reactor of claim 1, wherein said duty cycle is less than 1%.

3. The reactor of claim 1, wherein said pulses have a power pulse width of no more than 1ms.

4. The reactor of claim 3, wherein said pulse width is no more than 200 $\mu$s.

5. The reactor of claim 1, wherein said magnetron comprises a closed outer pole of one magnetic polarity surrounding an inner pole of a second magnetic polarity.

6. A pulsed magnetron sputter reactor, comprising:
   a plasma sputter reactor having a target and a pedestal for supporting a substrate to be sputter deposited in opposition to said target;
   a magnetron having an area of less than 20% of the area of the target and being rotatable about a back of said target; and
   a power supply connected to said target and delivering pulses of power with a duty cycle of less than 10%;
   wherein said power supply delivers said pulses braving a peak power level rising from a background power level, whereby power delivered from said power supply does not fill below a finite level between said pulses, whereby a plasma is continuously maintained in said reactor between said pulses.

7. The reactor of claim 6, wherein a ratio of said peak power level to said finite level is at least 10.

8. The reactor of claim 7, wherein said ratio is at least 100.

9. A pulsed magnetron sputter reactor, comprising:

a plasma sputter reactor having a target and a pedestal for supporting a substrate to be sputter deposited in opposition to said target;

a magnetron positioned at a back of said target;

an adjustable DC power supply connected to said target delivering a selected negative DC voltage;

a pulsed power supply connected in parallel with said adjustable DC power supply and delivering pulses of negative voltage with a duty cycle of less than 10%; and a motor for rotating said magnetron at a rotation frequency and wherein said power supply delivers said pulses at a repetition frequency, wherein said rotation frequency is desynchronized from said repetition frequency such that said pulses are delivered at respective times at which said magnetron is respectively positioned at at least ten different angular positions at said back of said target.

10. A pulsed magnetron sputter reactor, comprising:

a plasma sputter reactor having a target and a pedestal for supporting a substrate to be sputter deposited in opposition to said target;

a magnetron positioned at a back of said target;

an adjustable DC power supply connected to said target delivering a selected negative DC voltage; and a pulsed power supply connected in parallel with said adjustable DC power supply and delivering pulses of negative voltage with a duty cycle of less than 10%.

11. A pulsed magnetron sputter reactor, comprising:

a plasma sputter reactor having a target and a pedestal for supporting a substrate to be sputter deposited in opposition to said target;

a magnetron positioned at a back of said target;

an adjustable DC power supply connected to said target delivering a selected negative DC voltage; and a pulsed power supply connected in parallel with said adjustable DC power supply and delivering pulses of negative voltage with a duty cycle of less than 1%.

12. A pulsed magnetron sputter reactor, comprising:

a plasma sputter reactor having a target and a pedestal for supporting a substrate to be sputter deposited in opposition to said target;

a magnetron positioned at a back of said target;

an adjustable DC power supply connected to said target delivering a selected negative DC voltage; and a pulsed power supply connected in parallel with said adjustable DC power supply and delivering pulses of negative voltage with a duty cycle of less than 10%;

wherein said adjustable DC power supply is effective at igniting and maintaining a plasma in said plasma sputter reactor without use of said pulsed power supply.

13. A pulsed magnetron sputter reactor, comprising:

a plasma sputter reactor having a target and a pedestal for supporting a substrate to be sputter deposited in opposition to said target;

a magnetron positioned at a back of said target, wherein said magnetron is rotatable about a central axis of said target and has an area of no more than 20% of that of said target;

an adjustable DC power supply connected to said target delivering a selected negative DC voltage; and a pulsed power supply connected in parallel with said adjustable DC power supply and delivering pulses of negative voltage with a duty cycle of less than 10%.

14. A method of operating a sputter reactor, comprising the steps of:

rotating a magnetron about the back of a target of the reactor, said back being on an opposite side of said target than a front thereof facing a substrate to be sputter coated, said magnetron having an area of no more than 20% of an area of said target; and applying pulses of power of negative voltage to said target to excite a plasma in said reactor, said pulses having a duty cycle of less than 10%.

15. The method of claim 14, wherein said duty cycle is less than 1%.

16. The method of claim 14, wherein said pulses comprises substantially DC power during said pulses.

17. A method of operating a sputter reactor, comprising the steps of rotating a magnetron about the back of a target of the reactor, said back being on an opposite side of said target than a front thereof facing a substrate to be sputter coated, said magnetron having an area of no more than 20% of an area of said target;

applying pulses of power to said target to excite a plasma in said reactor, said pulses having a duty cycle of less than 10%; and applying at least a minimum level of power to said target between said pulses sufficient to maintain said plasma in a chamber of said sputter reactor between said pulses.

18. The method of claim 17, wherein said step of applying pulses applies a peak level of power to said target; and wherein said step of applying at least a minimum level of power applies a background level; and wherein a ratio of said peak level to said background level is at least 10.

19. The method of claim 18, wherein said ratio is at least 100.

20. The method of claim 19, wherein said ratio is at least 1000.

21. A multi-step sputtering process performed in a sputter reactor including a pulsed power supply delivering a sequence of pulses at a duty cycle to a target, said process comprising the steps of:

a first step of delivering said pulses at a first duty cycle to said target to irradiate a substrate with particles sputtered from said target; and a second step of delivering said pulses at a second duty cycle different from said first duty to said target to irradiate said substrate with particles sputtered from said target;

wherein at least one of said duty cycles is less than 10%.

22. The process of claim 21, wherein said at least one of said duty cycles is less than 1%.

23. The process of claim 21, wherein said first duty cycle is less than said second duty cycle.

24. The process of claim 21, further comprising, during said first and second steps, rotating about a central axis of said target a magnetron having an area of no more than 20% of that of said target.

25. The process of claim 21, wherein said pulsed power supply is limited by the energy in each of said pulses.

26. A pulsed magnetron sputter reactor, comprising:

a plasma sputter reactor having a target and a pedestal for supporting a substrate to be sputter deposited in opposition to said target and an anode with respect to a cathode of said target;

a magnetron rotatable about a back of said target; and a power supply connected to said target and delivering pulses to said target of power of negative voltage with respect to said anode and having a duty cycle of less than 10%.

27. A method of operating a sputter reactor, comprising the steps of:

rotating a magnetron about the back of a target of the reactor, said back being on an opposite side of said target than a front thereof facing a substrate to be sputter coated, said reactor having an anode with respect to a cathode of said target; and applying to said target pulses of power of negative power with respect to said anode target to excite a plasma in said reactor, said pulses having a duty cycle of less than 10%.

* * * * *